United States Patent
Chang et al.

(10) Patent No.: US 10,529,611 B2
(45) Date of Patent: Jan. 7, 2020

(54) BARRIER SEAL FOR ELECTROSTATIC CHUCK

(71) Applicant: MFC SEALING TECHNOLOGY CO., LTD., New Taipei (TW)

(72) Inventors: Yo-Yu Chang, New Taipei (TW); Chun-Yao Huang, New Taipei (TW)

(73) Assignee: MFC Sealing Technology Co., Ltd., New Taipei ( * ) Notice: Subject to any disclaimer, the term of this patent is extended or adjusted under 35 U.S.C. 154(b) by 789 days.

(21) Appl. No.: 15/001,291

(22) Filed: Jan. 20, 2016

(65) Prior Publication Data

US 2016/0240421 A1    Aug. 18, 2016

(30) Foreign Application Priority Data

Feb. 16, 2015    (TW) .............................. 104105259 A

(51) Int. Cl.
  *H01L 21/683*    (2006.01)
  *H01J 37/32*     (2006.01)
  *F16J 15/10*     (2006.01)

(52) U.S. Cl.
  CPC ........ *H01L 21/6833* (2013.01); *F16J 15/106* (2013.01); *H01J 37/3288* (2013.01); *H01J 37/32513* (2013.01); *H01J 37/32697* (2013.01); *H01J 37/32715* (2013.01)

(58) Field of Classification Search
  CPC ........... H01J 37/32513; H01J 37/32559; H01J 37/32715; H01L 21/6833
  See application file for complete search history.

(56) References Cited

U.S. PATENT DOCUMENTS

| 5,636,098 | A |   | 6/1997 | Salfelder et al. |
| 5,805,408 | A | * | 9/1998 | Maraschin .......... H01L 21/6833 361/234 |
| 2007/0256786 | A1 | * | 11/2007 | Zhou ................. H01J 37/32477 156/345.34 |
| 2009/0243236 | A1 |   | 10/2009 | Hida et al. |

(Continued)

FOREIGN PATENT DOCUMENTS

| JP | H06279974 A | 10/1994 |
| TW | I503920 B   | 10/2015 |

(Continued)

*Primary Examiner* — Thienvu V Tran
*Assistant Examiner* — Christopher J Clark
(74) *Attorney, Agent, or Firm* — Alan D. Kamrath; Karin L. Williams; Mayer & Williams PC

(57) ABSTRACT

Provided is a barrier seal for an electrostatic chuck in the plasma etching process. The barrier seal comprises multiple sealing portions to block the connecting layer of the electrostatic chuck and the plasma gas. The groove of the electrostatic chuck may be completely filled by the barrier seal. Even one of the multiple sealing portions is destroyed in the plasma etching process by the plasma gas, the barrier seal still prevents leaking of the electrostatic chuck effectively. The barrier seal provides a buffer period for engineers to replace the damaged barrier seal before the leaking occurs. Danger of leaking caused by abrupt breaking of the barrier seal is reduced. Furthermore, the barrier seal facilitates stability and safety of the plasma etching process. The yield of products manufactured by the electrostatic chuck may be improved.

8 Claims, 11 Drawing Sheets

(56) References Cited

U.S. PATENT DOCUMENTS

| | | | | |
|---|---|---|---|---|
| 2010/0027188 A1* | 2/2010 | Liu | .................... | H01L 21/6833 |
| | | | | 361/234 |
| 2010/0108261 A1* | 5/2010 | Augustino | .............. | H01J 37/20 |
| | | | | 156/345.1 |
| 2013/0097840 A1* | 4/2013 | Schaefer | .......... | H01L 21/68757 |
| | | | | 29/428 |
| 2013/0263427 A1* | 10/2013 | Newton | ............ | H01J 37/32495 |
| | | | | 29/450 |
| 2013/0342952 A1* | 12/2013 | Nagai | ................. | H01L 21/6833 |
| | | | | 361/234 |
| 2014/0202635 A1* | 7/2014 | Yamaguchi | ....... | H01J 37/32733 |
| | | | | 156/345.51 |
| 2014/0231018 A1* | 8/2014 | Aoki | ................ | H01J 37/32541 |
| | | | | 156/345.51 |
| 2015/0179412 A1* | 6/2015 | Chhatre | ............. | H01J 7/32642 |
| | | | | 438/710 |
| 2017/0092472 A1* | 3/2017 | Koiwa | ................... | F28F 27/02 |

FOREIGN PATENT DOCUMENTS

| | | | | |
|---|---|---|---|---|
| WO | WO-2011155479 A1 * | 12/2011 | ........ | H01J 37/32091 |
| WO | WO2013059590 A1 | 4/2013 | | |

* cited by examiner

BARRIER SEAL FOR ELECTROSTATIC CHUCK

BACKGROUND OF THE INVENTION

1. Field of the Invention

The present invention relates to a barrier seal for use with an electrostatic chuck in a plasma etching equipment, and more particularly to a barrier seal that may be mounted into a groove of the electrostatic chuck with multiple sealing portions.

2. Description of the Related Art

Conventional plasma etching equipment is shown in FIG. 9. The plasma etching equipment comprises an electrostatic chuck 90. The electrostatic chuck 90 comprises an upper element 91 which is made of dielectric ceramic materials, a bottom element 92, and a soft connecting layer 93. The connecting layer 93 connects to the upper element 91 and the bottom element 92. The electrostatic chuck 90 further comprises an extending element 100 around the electrostatic chuck 90. There are a gap 110 and a groove 113 between the electrostatic chuck 90 and the extending element 100. Plasma gas 120 can flow into the space between the electrostatic chuck 90 and the extending element 100 through the gap 110, and the plasma gas 120 further permeates into the groove 113 and destroys the connecting layer 93 to induce the erosion of the electrostatic chuck 90 and a leaking point in the plasma etching process. The working fluid in the electrostatic chuck 90 may flow out to the exterior of the electrostatic chuck 90 through the leaking point and induce pollution of the environment.

In order to resolve said problems, disposing epoxy 130 in the groove 113 is a skill in the art as shown in FIG. 10. The groove 113 is filled by the epoxy 130 to prevent the damage of the connecting layer 93 by the plasma gas 120. However, the epoxy 130 is eroded easily and becomes thinner by the plasma gas 120. After plasma etching for a long term, a leaking point is formed and the epoxy 130 loses its protection function gradually. In addition, the lifetime of the epoxy 130 is hard to estimate. Engineers may not timely block the leaking point before the gas leak happens.

Another skill in the art provides a replaceable elastomer ring 140 to substitute for the epoxy 130 as shown in FIG. 11. The elastomer ring 140 may overcome the above problems of the epoxy 130. However there is only a sealing portion 150 between the connecting layer 93 and the groove 113. The size of the groove 113 is very small. It is hard to install the elastomer ring 140 into the groove 113 evenly. As the elastomer ring 140 cannot be disposed in the groove 113 evenly, engineers may hardly estimate the lifetime of the elastomer ring 140. When the elastomer ring 140 is unable to block the connecting layer 93, the erosion of the connecting layer 93 and the pollution will be induced. Many problems still exist in sealing the groove 113 of the electrostatic chuck 90 in a plasma etching equipment.

SUMMARY OF THE INVENTION

An objective of the present invention is to provide a barrier seal to be disposed in the groove of the electrostatic chuck with multiple sealing portions. The barrier seal of the present invention may not induce the gas leak caused by partial damages of the barrier seal. Furthermore, the barrier seal provides a buffer period to estimate the lifetime of the barrier seal. Engineers can replace the damaged barrier seal before the leaking occurs. The present invention facilitates stability and safety of the plasma etching process.

To achieve the foregoing objective, the present invention provides a barrier seal for use with an electrostatic chuck including an upper element, a bottom element, and a connecting layer connecting the upper element and the bottom element, and a groove formed among an outer edge of the connecting layer, the upper element, and the bottom element, and the barrier seal being an elastomer ring and comprising:

a primary sealing portion comprising at least one edge toward the groove, wherein a side of the at least one edge is a chamfered edge; and at least one minor sealing portion protruding away from a side of the primary sealing portion.

The advantage of the present invention is utilizing the primary sealing portion and the at least one minor sealing portion to construct double sealing portions to protect the connecting layer. If the primary sealing portion is eroded by the plasma gas, the at least one minor sealing portion still blocks between the connecting layer and the plasma gas continuously. The gas leak of the electrostatic chuck does not occur abruptly. The at least one minor sealing portion provides a buffer period to replace the damaged barrier seal for engineers. The present invention prevents induction of the environmental pollution by the working fluid from the electrostatic chuck. The plasma etching process may be safe in the semiconductor industry. The qualities of products manufactured by the electrostatic chuck may be stable.

Particularly, the cross-section of the barrier seal is in an L shape. A side of the primary sealing portion toward the groove comprises an edge, and the edge is a chamfered edge. The barrier seal comprises a first minor sealing portion. The first minor sealing portion protrudes from an inner side of the primary sealing portion toward the groove. A side of the first minor sealing portion toward the groove comprises two edges, and the two edges are chamfered edges. The advantage of the present invention is utilizing the L-shaped barrier seal to fit with the L-shaped groove of the electrostatic chuck. The chamfered edges of the primary sealing portion and the first minor sealing portion help the elastomer ring to be disposed in the groove easily. Then the groove may be completely filled and sealed by the elastomer ring. The electrostatic chuck is not interrupted from working due to the fact that damages of the elastomer ring occur abruptly.

More particularly, the barrier seal comprises at least one second minor sealing portion. The at least one second minor sealing portion protrudes from an outer side of the primary sealing portion in a direction away from the groove. The at least one second minor sealing portion comprises a chamfered edge away from the groove. The advantage of the present invention is utilizing the primary sealing portion, the at least one minor sealing portion, and the at least one second minor sealing portion to construct triple sealing portions to protect the connecting layer. The gap between the electrostatic chuck and the extending element may be blocked by the at least one second minor sealing portion. The present invention is more effective to prevent the plasma gas from permeating through the gap into the groove to destroy the connecting layer.

Particularly, the cross-section of the barrier seal is in a T shape. A side of the primary sealing portion toward the groove comprises two edges, and the two edges are chamfered edges. The barrier seal comprises a first minor sealing portion. The first minor sealing portion protrudes from an inner side of the primary sealing portion toward the groove. A side of the first minor sealing portion toward the groove comprises two edges, and the two edges are chamfered edges. The advantage of the present invention is utilizing the T-shaped barrier seal to fit with the T-shaped groove of the electrostatic chuck. The chamfered edges of the primary sealing portion and the first minor sealing portion help the elastomer ring to be disposed in the groove easily. Then the groove may be completely filled and sealed by the elastomer ring. The electrostatic chuck is not interrupted from working due to the fact that damages of the elastomer ring occur abruptly.

More particularly, the barrier seal comprises at least one second minor sealing portion. The at least one second minor sealing portion protrudes from an outer side of the primary sealing portion in a direction away from the groove. The at least one second minor sealing portion comprises a chamfered edge away from the groove. The advantage of the present invention is utilizing the primary sealing portion, the at least one minor sealing portion, and the at least one second minor sealing portion to construct triple sealing portions to protect the connecting layer. The gap between the electrostatic chuck and the extending element may be blocked by the at least one second minor sealing portion. The present invention is effective in preventing the plasma gas from permeating through the gap into the groove to destroy the connecting layer.

Most particularly, the barrier seal further comprises a third minor sealing portion to substitute for the at least one second minor sealing portion. The third minor sealing portion protrudes from an outer side of the primary sealing portion in a direction away from the groove. A height of the third minor sealing portion is larger than a height of the primary sealing portion, and the third minor sealing portion is in contact with the upper element and the bottom element of the electrostatic chuck respectively.

The advantage of the present invention is utilizing the third minor sealing portion to substitute for the at least one second minor sealing portion first. Furthermore, the advantage of the present invention is also utilizing the primary sealing portion, the at least one minor sealing portion, and the third minor sealing portion to construct triple sealing portions to protect the connecting layer. The gap between the electrostatic chuck and the extending element may be blocked and partially filled by the third minor sealing portion. The present invention is effective in enduring the erosion from the plasma gas.

DETAILED DESCRIPTION OF THE INVENTION

Figure 1:
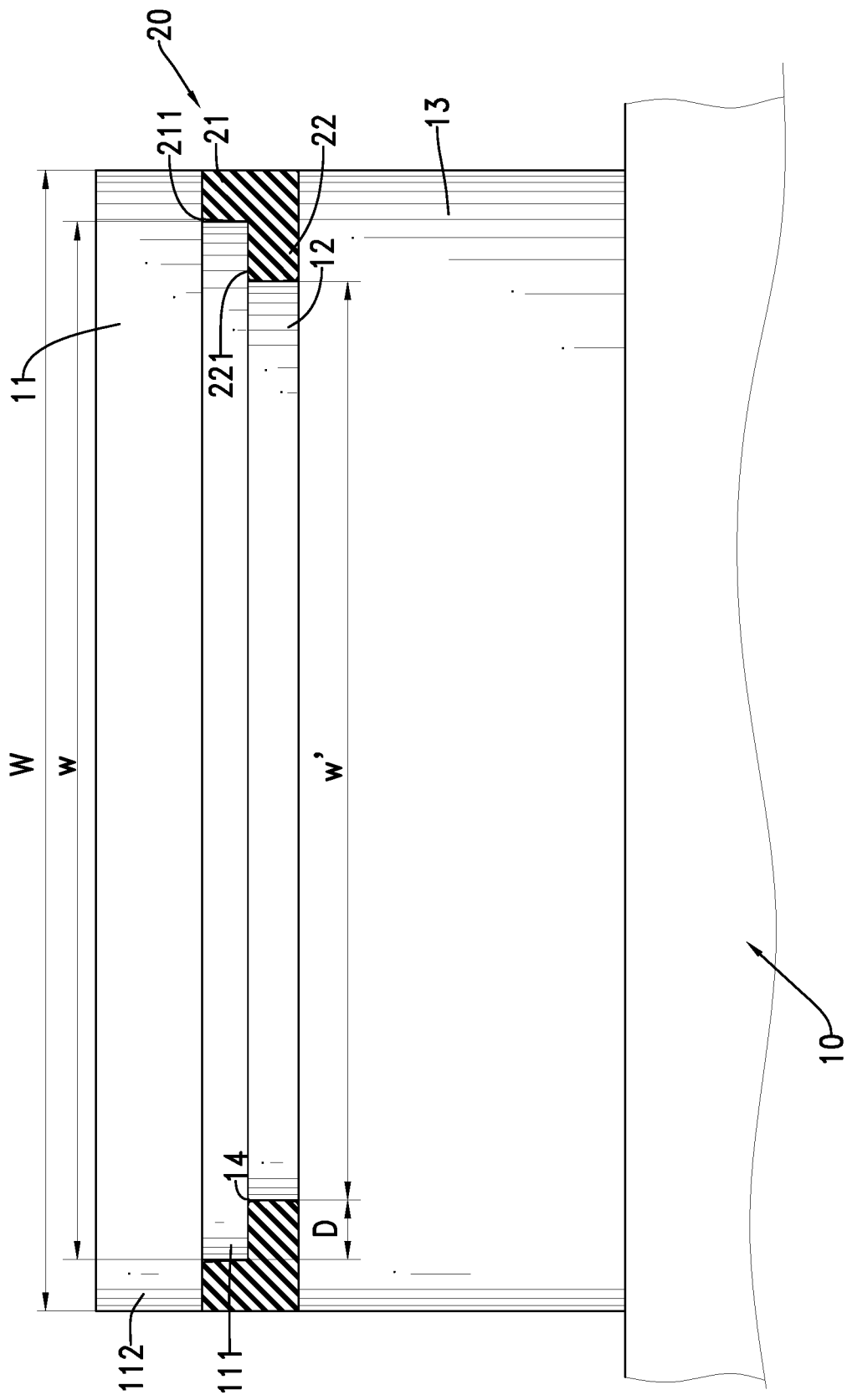
FIG. 1 is a schematic view of the first embodiment of the barrier seal disposed on the groove of an electrostatic chuck in accordance with the present invention.

A barrier seal of the present invention is used for a sidewall of an electrostatic chuck 10. With reference to FIG. 1, the electrostatic chuck 10 comprises an upper element 11, a connecting layer 12, and a bottom element 13. The upper element 11 has a bottom portion 111 and a top portion 112. A diameter of the bottom portion w is less than a diameter W of the top portion. The connecting layer 12 connects to the bottom portion 111 of the upper element 11 and the bottom element 13. A groove 14 is formed around an outer surface of the connecting layer 12. The groove 14 is also between the upper element 11 and the bottom element 13.

Before filling the groove 14 by the barrier seal, part of the outer connecting layer 12 is removed to get a depth D and a diameter w'. The diameter w' of the connecting layer is less than the diameter w of the bottom portion. Then the cross-section of the groove 14 is in an L shape with reference to FIGS. 1 and 2.

With reference to FIG. 1, the first embodiment of the barrier seal is an elastomer ring 20. The cross-section of the elastomer ring 20 is in an L shape, and the elastomer ring 20 is corresponding to the groove 14 in shape. The elastomer ring 20 comprises: a primary sealing portion 21 and a first minor sealing portion 22. The primary sealing portion 21 toward the groove 14 further comprises an edge 211. The edge 211 is a chamfered edge. The edge 211 is corresponding to a corner between the bottom portion 111 and the top portion 112 of the upper element 11. The first minor sealing portion 22 protrudes from an inner side of the primary sealing portion 21 toward the groove 14. The first minor sealing portion 22 toward the groove 14 comprises two edges 221. The two edges 221 are also chamfered edges. One of the two edges 221 is corresponding to a corner between the bottom portion 111 of the upper element 11 and the connecting layer 12. Another one of the two edges 221 is corresponding to a corner between the connecting layer 12 and the bottom element 13. The chamfered edges help the elastomer ring 20 to be disposed in the groove 14 easily. Then the groove 14 may be completely filled and evenly sealed by the elastomer ring 20.

Figure 2:
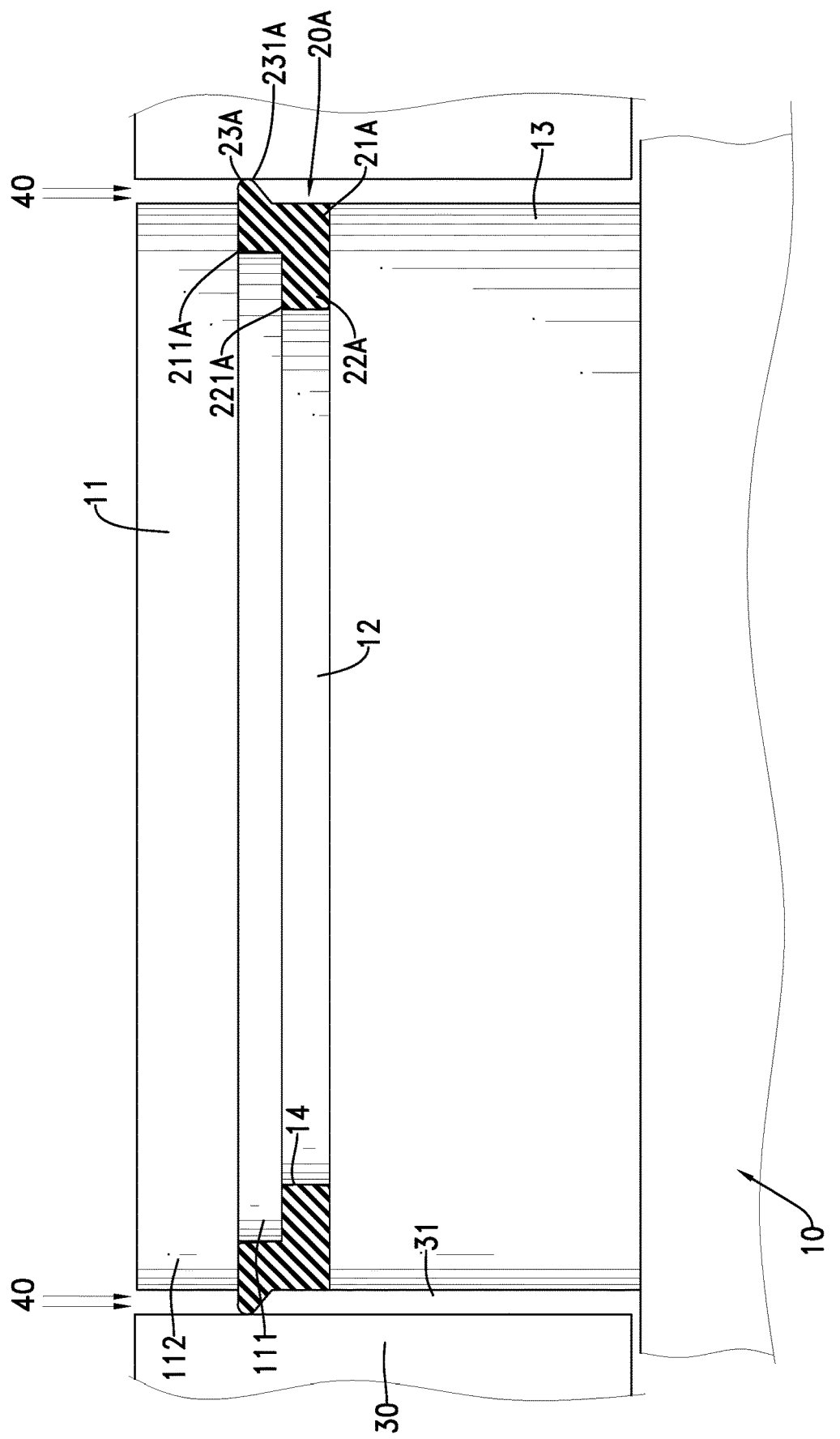
FIG. 2 is a schematic view of the second embodiment of the barrier seal disposed on the groove of an electrostatic chuck in accordance with the present invention.

With reference to FIG. 2, the electrostatic chuck 10 further comprises an extending element 30 around the sidewall of the electrostatic chuck 10. There is a gap 31 between the electrostatic chuck 10 and the extending element 30. The gap 31 connects to the groove 14 directly. Plasma gas 40 may destroy the connecting layer 12 through the gap 31 and the groove 14 in a plasma etching process. The erosion and the leaking occur after the connecting layer 12 is damaged by the plasma gas 40.

With reference to FIG. 2, the second embodiment of the barrier seal is an elastomer ring 20A. The cross-section of the elastomer ring 20A is substantially in an L shape, and the elastomer ring 20A is corresponding to the groove 14 in shape. The elastomer ring 20A comprises: a primary sealing portion 21A, a first minor sealing portion 22A, and a second minor sealing portion 23A. The primary sealing portion 21A toward the groove 14 further comprises an edge 211A. The edge 211A is a chamfered edge. The edge 211A is corresponding to a corner between the bottom portion 111 and the top portion 112 of the upper element 11. The first minor sealing portion 22A protrudes from an inner side of the primary sealing portion 21A toward the groove 14. The first minor sealing portion 22A toward the groove 14 comprises two edges 221A. The two edges 221A are also chamfered edges. One of the two edges 221A is corresponding to a corner between the bottom portion 111 of the upper element 11 and the connecting layer 12. Another one of the two edges 221A is corresponding to a corner between the connecting layer 12 and the bottom element 13. The chamfered edges help the elastomer ring 20A to be disposed in the groove 14 easily. Then the groove 14 may be completely filled and sealed by the elastomer ring 20A.

The second minor sealing portion 23A protrudes from an outer side of the primary sealing portion 21A in a direction away from the groove 14. The second minor sealing portion 23A is very close to an interface between the primary sealing portion 21A and the top portion 112 of the upper element 11. The second minor sealing portion 23A comprises a chamfered edge 231A away from the groove 14. The gap 31 between the electrostatic chuck 10 and the extending element 30 may be blocked by the second minor sealing portion 23A. The second minor sealing portion 23A may stop the plasma gas 40 from flowing into the gap 31 and the groove 14. The second minor sealing portion 23A effectively prevents the damage of the connecting layer 12 caused by the etching of the plasma gas 40.

Figure 3:
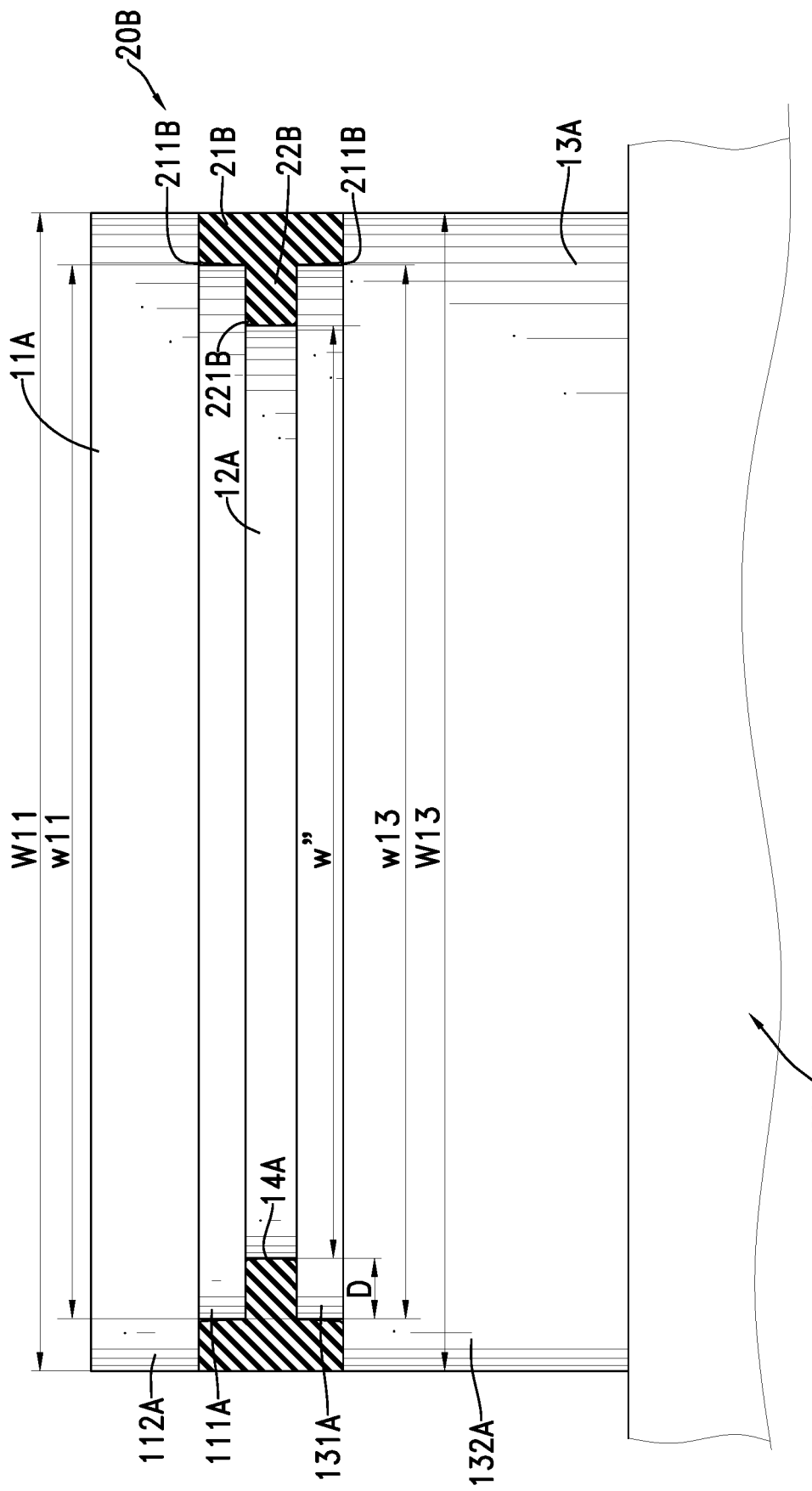
FIG. 3 is a schematic view of the third embodiment of the barrier seal disposed on the groove of an electrostatic chuck in accordance with the present invention.

The present invention of the barrier seal is used for a sidewall of another kind of the electrostatic chuck 10A. With reference to FIG. 3, another kind of the electrostatic chuck 10A comprises an upper element 11A, a connecting layer 12A, and a bottom element 13A. The upper element 11A has a bottom portion 111A and a top portion 112A. A diameter of the bottom portion w11 is less than a diameter of the top portion W11. The bottom element 13A has a top unit 131A and a bottom unit 132A. A diameter w13 of the top unit 131A is less than a diameter W13 of the bottom unit 132A. The connecting layer 12A connects to the bottom portion 111A of the upper element 11A and the top unit 131A of the bottom element 13A. A groove 14A is formed around an outer surface of the connecting layer 12A. The groove 14A is between the upper element 11A and the bottom element 13A.

Before filling the groove 14A by the barrier seal, part of the outer connecting layer 12A is removed to get a depth D and a diameter w". The diameter w" of the connecting layer is less than the diameter w11 of the bottom portion and the diameter w13 of the top unit. Then the cross-section of the groove 14A is in a T shape with reference to FIGS. 3, 4 and 5.

With reference to FIG. 3, the third embodiment of the barrier seal is an elastomer ring 20B. The cross-section of the elastomer ring 20B is in a T shape, and the elastomer ring 20B is corresponding to the groove 14A in shape. The elastomer ring 20B comprises: a primary sealing portion 21B and a first minor sealing portion 22B. The primary sealing portion 21B toward the groove 14A further comprises two edges 211B. The two edges 211B are chamfered edges. One of the two edges 211B is corresponding to a corner between the bottom portion 111A and the top portion 112A of the upper element 11A. Another one of the two edges 211B is corresponding to a corner between the top unit 131A and the bottom unit 132A of the bottom element 13A. The first minor sealing portion 22B protrudes from an inner side of the primary sealing portion 21B toward the groove 14A. The first minor sealing portion 22B toward the groove 14A comprises two edges 221B. The two edges 221B are also chamfered edges. One of the two edges 221B is corresponding to a corner between the bottom portion 111A of the upper element 11A and the connecting layer 12A. Another one of the two edges 221B is corresponding to a corner between the connecting layer 12A and the top unit 131A of the bottom element 13A. The chamfered edges help the elastomer ring 20B to be disposed in the groove 14A more easily. Then the groove 14A may be completely filled and sealed by the elastomer ring 20B.

Figure 4:
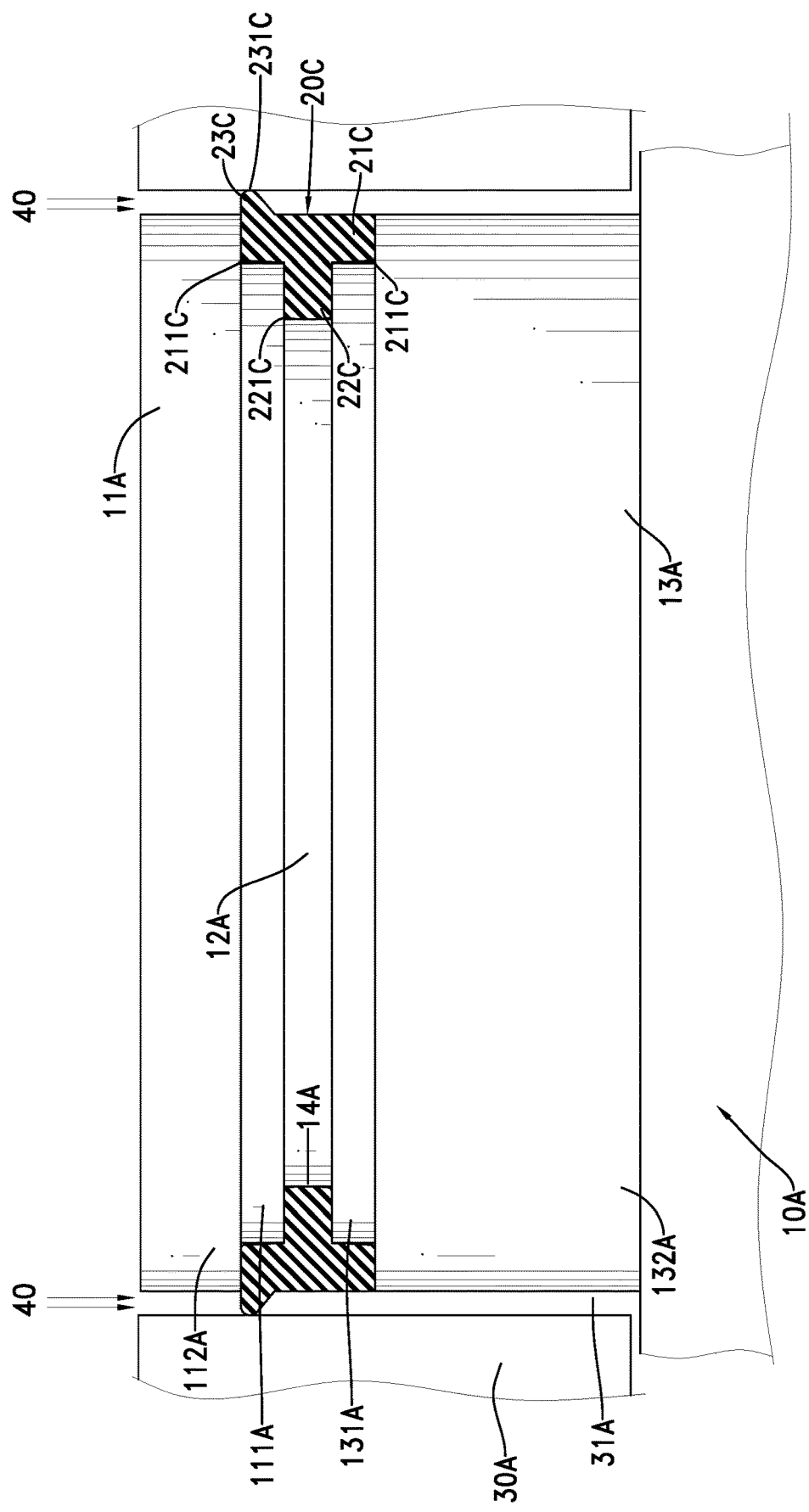
FIG. 4 is a schematic view of the fourth embodiment of the barrier seal disposed on the groove of an electrostatic chuck in accordance with the present invention.

With reference to FIG. 4, the electrostatic chuck 10A further comprises an extending element 30A around the sidewall of the electrostatic chuck 10A. There is a gap 31A between the electrostatic chuck 10A and the extending element 30A. The gap 31A connects to the groove 14A directly. Plasma gas 40 may destroy the connecting layer 12A through the gap 31A and the groove 14A in a plasma etching process. The erosion and the leaking occur after the connecting layer 12A is damaged by the plasma gas 40.

With reference to FIG. 4, the fourth embodiment of the barrier seal is an elastomer ring 20C. The cross-section of the elastomer ring 20C is substantially in a T shape, and the elastomer ring 20C is corresponding to the groove 14A in shape. The elastomer ring 20C comprises: a primary sealing portion 21C, a first minor sealing portion 22C, and a second minor sealing portion 23C. The primary sealing portion 21C toward the groove 14A further comprises two edges 211C. The two edges 211C are chamfered edges. One of the two edges 211C is corresponding to a corner between the bottom portion 111A and the top portion 112A of the upper element 11A. Another one of the two edges 211C is corresponding to a corner between the top unit 131A and the bottom unit 132A of the bottom element 13A. The first minor sealing portion 22C protrudes from an inner side of the primary sealing portion 21C toward the groove 14A. The first minor sealing portion 22C toward the groove 14A comprises two edges 221C. The two edges 221C are also chamfered edges. One of the two edges 221C is corresponding to a corner between the bottom portion 111A of the upper element 11A and the connecting layer 12A. Another one of the two edges 221C is corresponding to a corner between the connecting layer 12A and the top unit 131A of the bottom element 13A. The chamfered edges help the elastomer ring 20C to be disposed in the groove 14A easily. Then the groove 14A may be completely filled and sealed by the elastomer ring 20C.

The second minor sealing portion 23C protrudes from an outer side of the primary sealing portion 21C in a direction away from the groove 14A. The second minor sealing portion 23C is very close to an interface between the primary sealing portion 21C and the top portion 112A of the upper element 11A. The second minor sealing portion 23C comprises a chamfered edge 231C away from the groove 14A. The gap 31A between the electrostatic chuck 10A and the extending element 30A may be blocked by the second minor sealing portion 23C. The second minor sealing portion 23C may stop the plasma gas 40 from flowing into the gap 31A and the groove 14A. The second minor sealing portion 23C effectively prevents the damage of the connecting layer 12A caused by the etching of the plasma gas 40.

Figure 5:
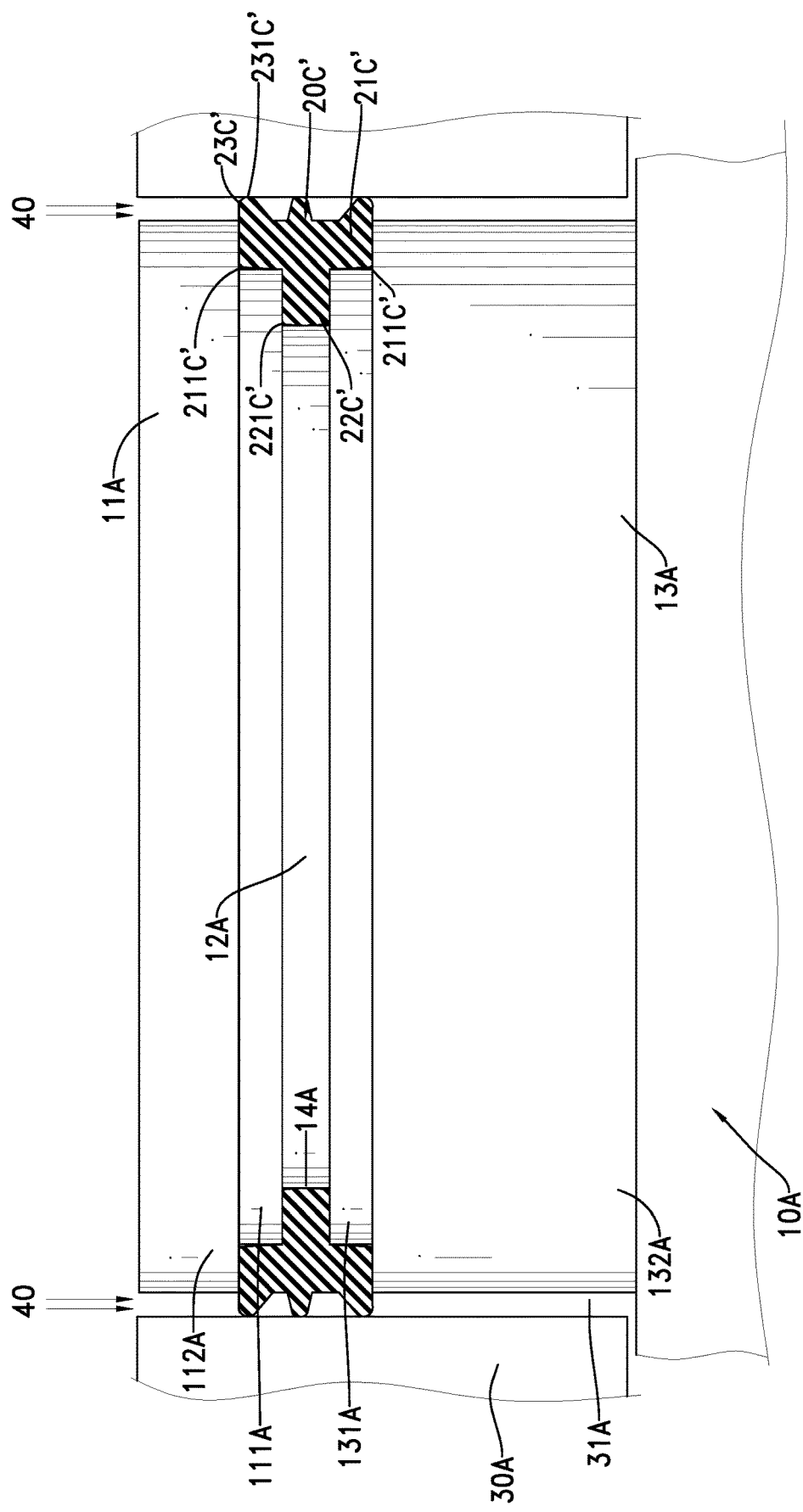
FIG. 5 is a schematic view of the fifth embodiment of the barrier seal disposed on the groove of an electrostatic chuck in accordance with the present invention.

With reference to FIG. 5, the fifth embodiment of the barrier seal is an elastomer ring 20C'. The cross-section of the elastomer ring 20C' is substantially in a T shape, and the elastomer ring 20C' is corresponding to the groove 14A in shape. The elastomer ring 20C' comprises: a primary sealing portion 21C', a first minor sealing portion 22C', and three components of the second minor sealing portion 23C'. The primary sealing portion 21C' toward the groove 14A further comprises two edges 211C'. The two edges 211C' are chamfered edges. One of the two edges 211C' is corresponding to a corner between the bottom portion 111A and the top portion 112A of the upper element 11A. Another one of the two edges 211C' is corresponding to a corner between the top unit 131A and the bottom unit 132A of the bottom element 13A. The first minor sealing portion 22C' protrudes from an inner side of the primary sealing portion 21C' toward the groove 14A. The first minor sealing portion 22C' toward the groove 14A comprises two edges 221C'. The two edges 221C' are also chamfered edges. One of the two edges 221C' is corresponding to a corner between the bottom portion 111A of the upper element 11A and the connecting layer 12A. Another one of the two edges 221C' is corresponding to a corner between the connecting layer 12A and the top unit 131A of the bottom element 13A. The chamfered edges help the elastomer ring 20C' to be disposed in the groove 14A easily. Then the groove 14A may be completely filled and sealed by the elastomer ring 20C'.

The three components of the second minor sealing portion 23C' protrude from an outer side of the primary sealing portion 21C' in a direction away from the groove 14A. The three components of the second minor sealing portion 23C' are formed respectively on a top position, a middle position, and a bottom position of the outer side of the primary sealing portion 21C'. Each one of the three components of the second minor sealing portion 23C' comprises a chamfered edge 231C' away from the groove 14A. The gap 31A between the electrostatic chuck 10A and the extending element 30A may be blocked by the three components of the second minor sealing portion 23C'. The three components of the second minor sealing portion 23C' may stop the plasma gas 40 from flowing into the gap 31A and the groove 14A. The three components of the second minor sealing portion 23C' effectively prevents the damage of the connecting layer 12A caused by the etching of the plasma gas 40. The number of the components on the second minor sealing portion 23C' is not limited to three. The mounting positions of the three components on the second minor sealing portion 23C' are not limited to the top position, the middle position, and the bottom position on the outer side of the primary sealing portion 21C' respectively. Engineers can change the numbers and mounting positions of the components on the second minor sealing portion 23C' selectively.

Figure 6:
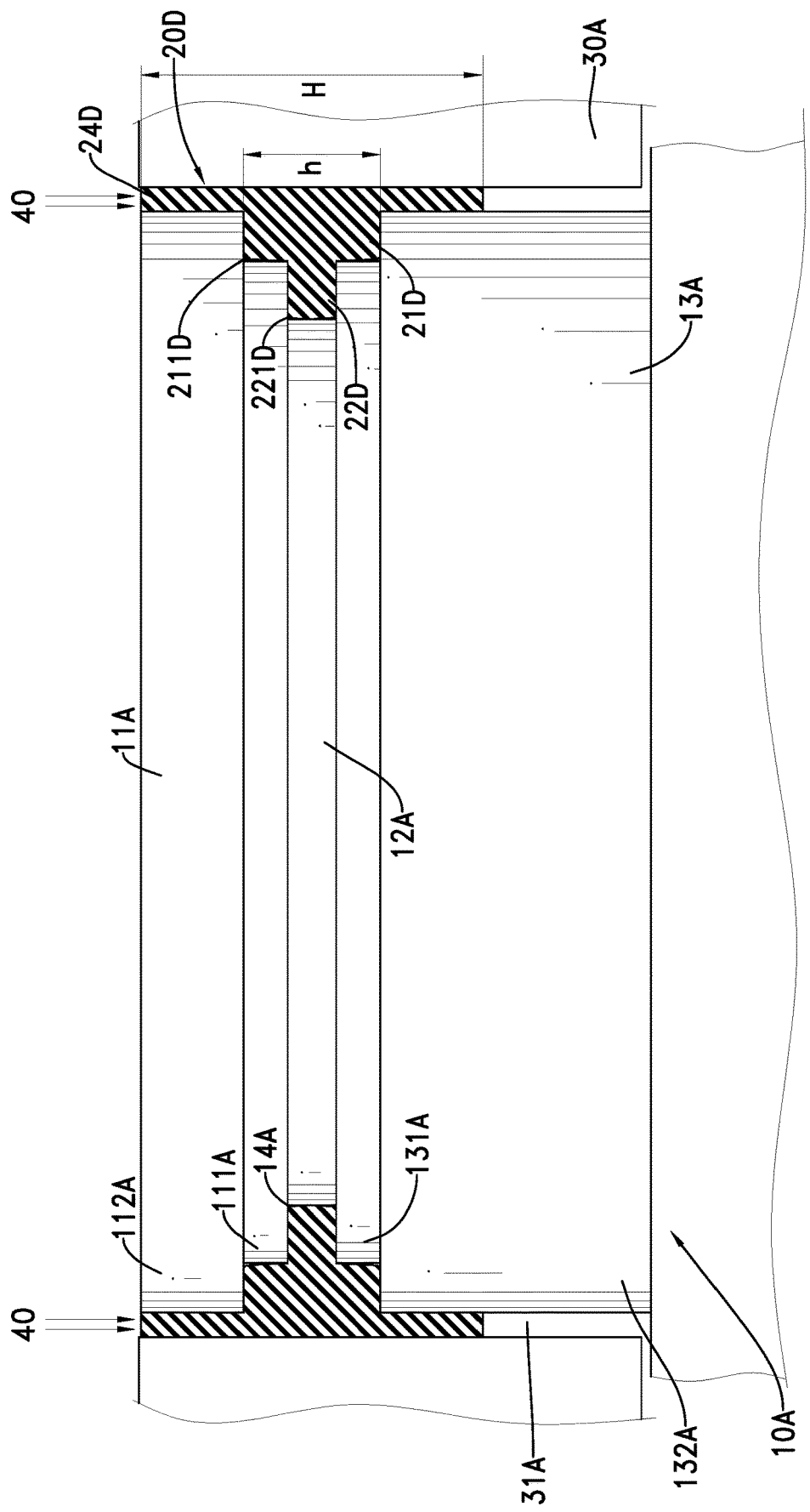
FIG. 6 is a schematic view of the sixth embodiment of the barrier seal disposed on the groove of an electrostatic chuck in accordance with the present invention.

With reference to FIG. 6, the sixth embodiment of the barrier seal is an elastomer ring 20D. The cross-section of the elastomer ring 20D is substantially in a T shape. The elastomer ring 20D comprises: a primary sealing portion 21D, a first minor sealing portion 22D, and a third minor sealing portion 24D. The primary sealing portion 21D toward the groove 14A further comprises two edges 211D. The two edges 211D are chamfered edges. One of the two edges 211D is corresponding to a corner between the bottom portion 111A and the top portion 112A of the upper element 11A. Another one of the two edges 211D is corresponding to a corner between the top unit 131A and the bottom unit 132A of the bottom element 13A. The first minor sealing portion 22D protrudes from an inner side of the primary sealing portion 21D toward the groove 14A. The first minor sealing portion 22D toward the groove 14A comprises two edges 221D. The two edges 221D are also chamfered edges. One of the two edges 221D is corresponding to a corner between the bottom portion 111A of the upper element 11A and the connecting layer 12A. Another one of the two edges 221D is corresponding to a corner between the connecting layer 12A and the top unit 131A of the bottom element 13A. The chamfered edges help the elastomer ring 20D to be disposed in the groove 14A easily. Then the groove 14A may be completely filled and sealed by the elastomer ring 20D.

The third minor sealing portion 24D protrudes from an outer side of the primary sealing portion 21D in a direction away from the groove 14A. A height H of the third minor sealing portion 24D is larger than a height h of the primary sealing portion 21D, and the third minor sealing portion 24D is in contact with the top portion 112A of the upper element 11A and the bottom unit 132A of the bottom element 13A respectively. The gap 31A between the electrostatic chuck 10A and the extending element 30A may be blocked by the third minor sealing portion 24D. The third minor sealing portion 24D may stop the plasma gas 40 from flowing into the gap 31A and the groove 14A. The third minor sealing portion 24D effectively prevents the damage of the connecting layer 12A caused by the etching of the plasma gas 40.

Figure 7:
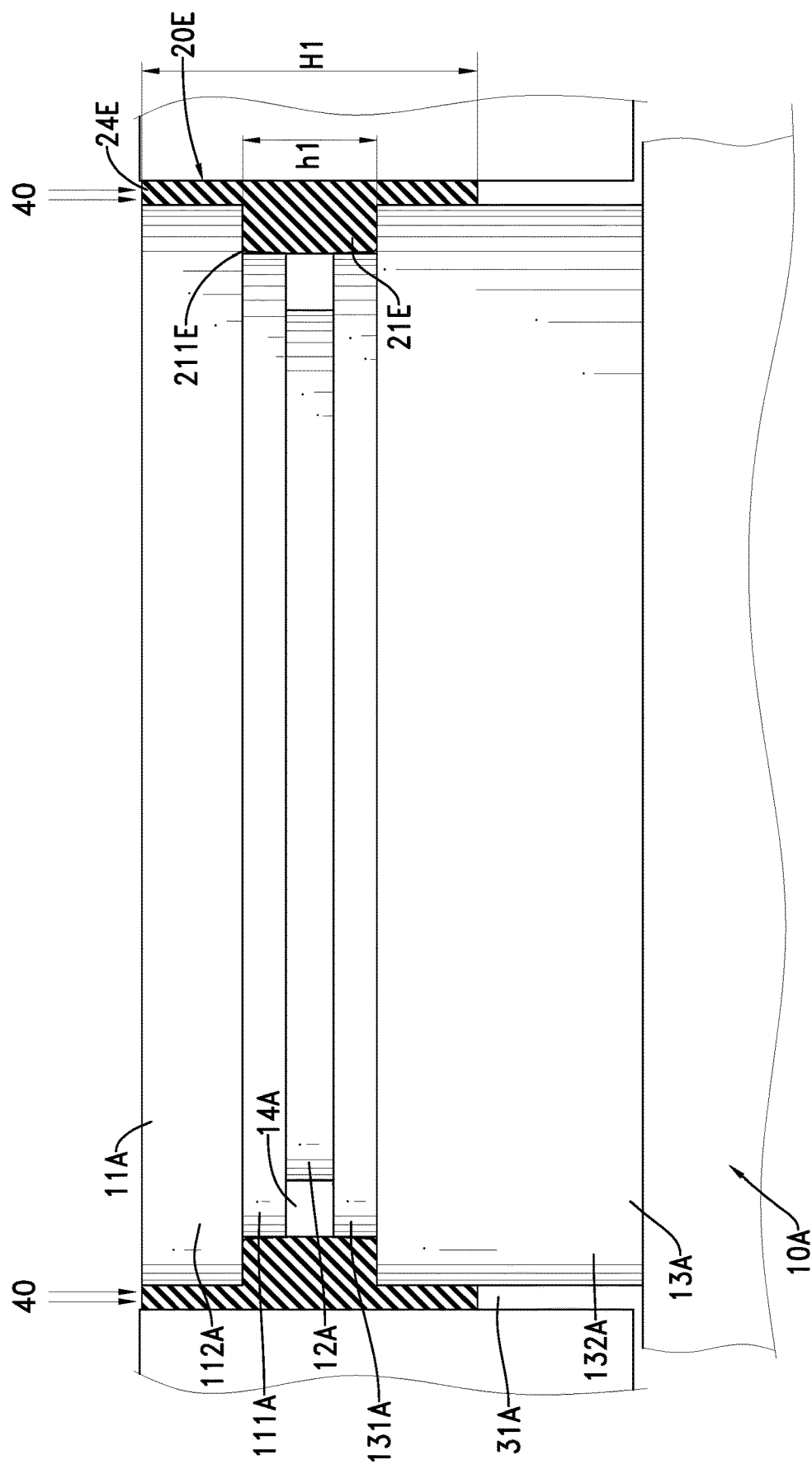
FIG. 7 is a schematic view of the seventh embodiment of the barrier seal disposed on the groove of an electrostatic chuck in accordance with the present invention.

With reference to FIG. 7, the seventh embodiment of the barrier seal is an elastomer ring 20E. The cross-section of the elastomer ring 20E is in the shape of a cap. The elastomer ring 20E comprises: a primary sealing portion 21E and a third minor sealing portion 24E. The primary sealing portion 21E toward the groove 14A further comprises two edges 211E. The two edges 211E are chamfered edges. One of the two edges 211E is corresponding to a corner between the bottom portion 111A and the top portion 112A of the upper element 11A. Another one of the two edges 211E is corresponding to a corner between the top unit 131A and the bottom unit 132A of the bottom element 13A. The third minor sealing portion 24E protrudes from an outer side of the primary sealing portion 21E in a direction away from the groove 14A. A height H1 of the third minor sealing portion 24E is larger than a height h1 of the primary sealing portion 21E, and the third minor sealing portion 24E is in contact with the top portion 112A of the upper element 11A and the bottom unit 132A of the bottom element 13A respectively. The gap 31A between the electrostatic chuck 10A and the extending element 30A may be blocked by the third minor sealing portion 24E. The third minor sealing portion 24E may stop the plasma gas 40 from flowing into the gap 31A and the groove 14A. The third minor sealing portion 24E effectively prevents the damage of the connecting layer 12A caused by the etching of the plasma gas 40.

Figure 8:
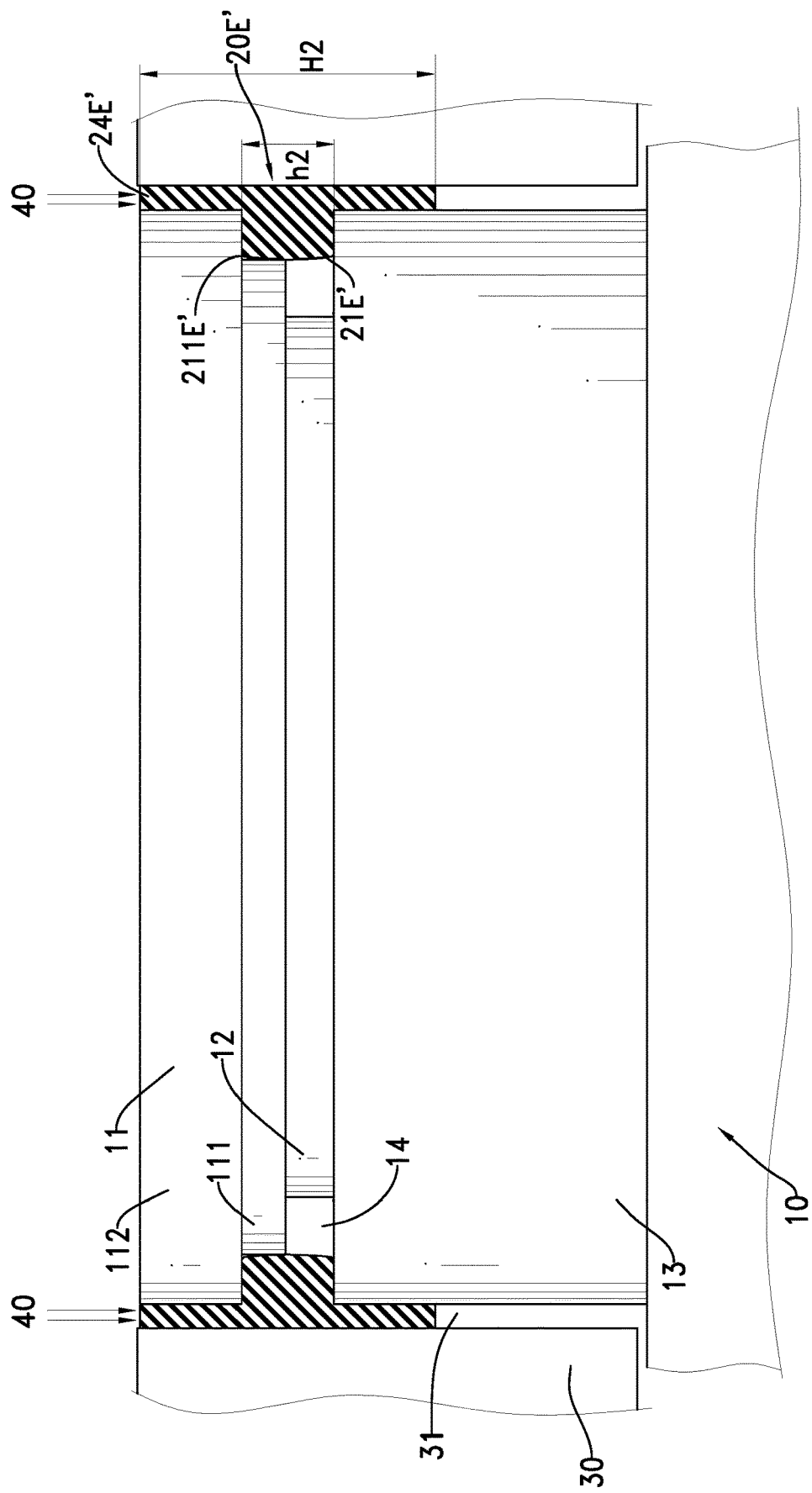
FIG. 8 is a schematic view of the eighth embodiment of the barrier seal disposed on the groove of an electrostatic chuck in accordance with the present invention.
Figure 9:
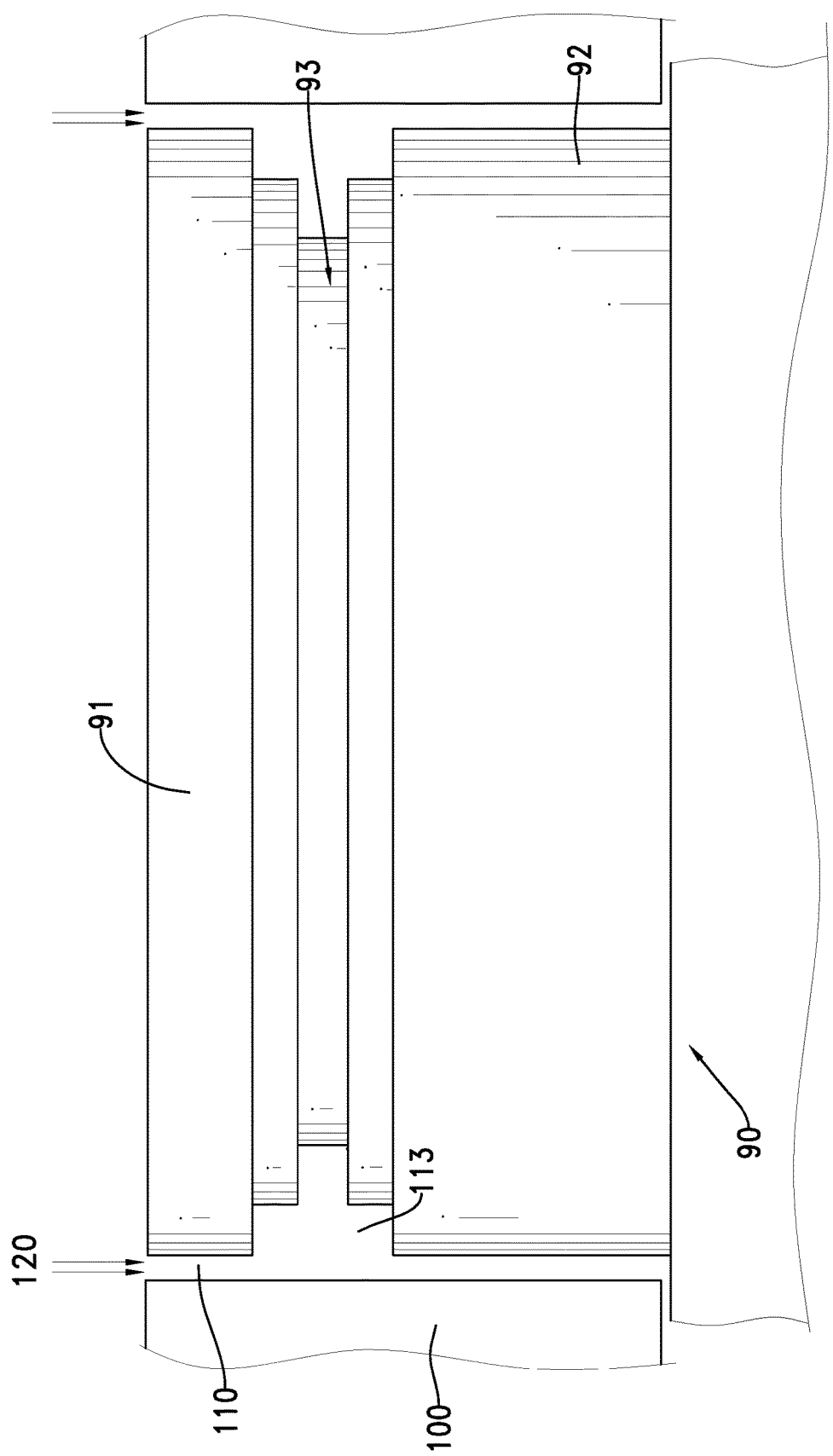
FIG. 9 is a schematic view of a conventional electrostatic chuck of an etching equipment with plasma.
Figure 10:
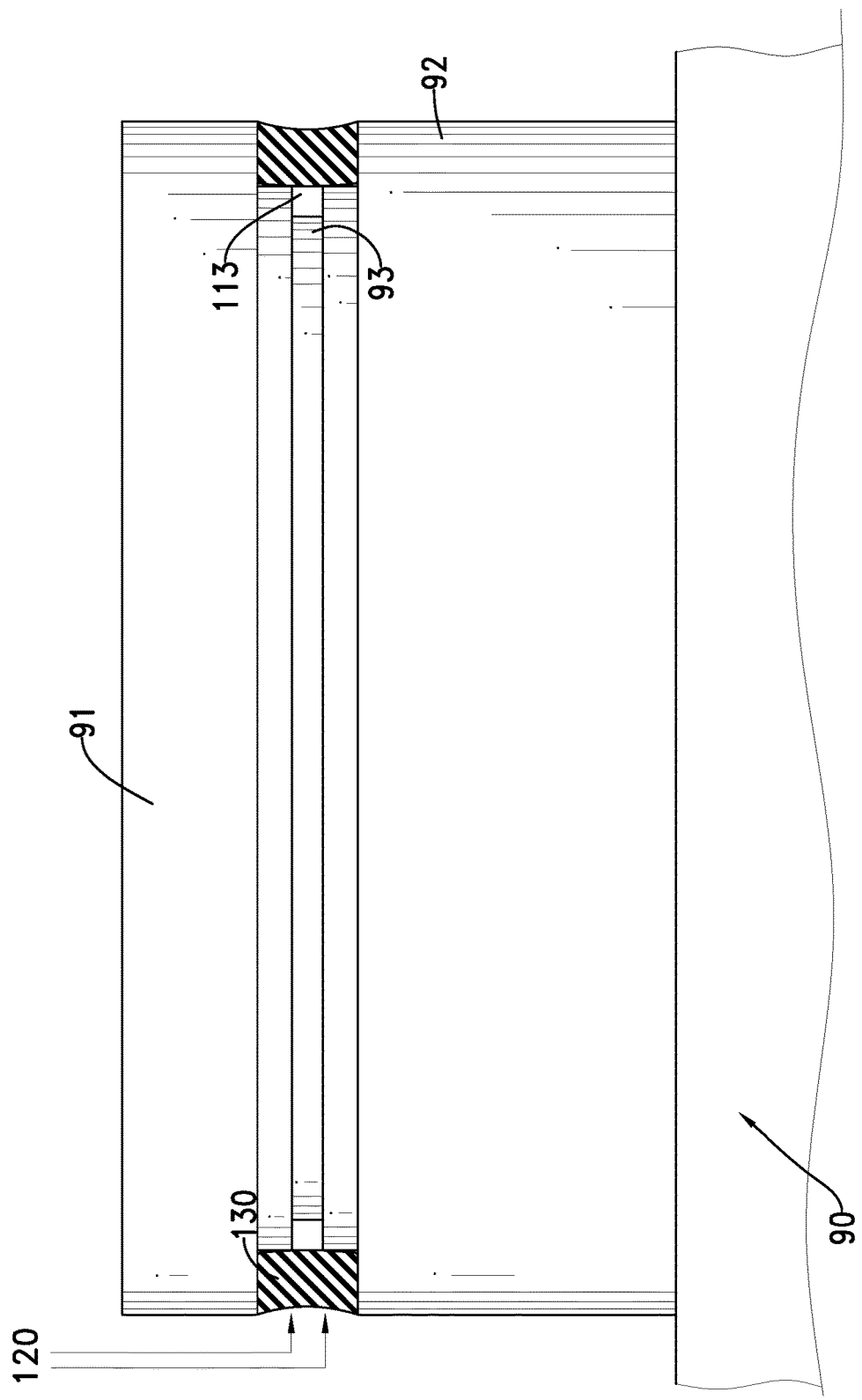
FIG. 10 is a schematic view of filling the groove of a conventional electrostatic chuck with epoxy.
Figure 11:
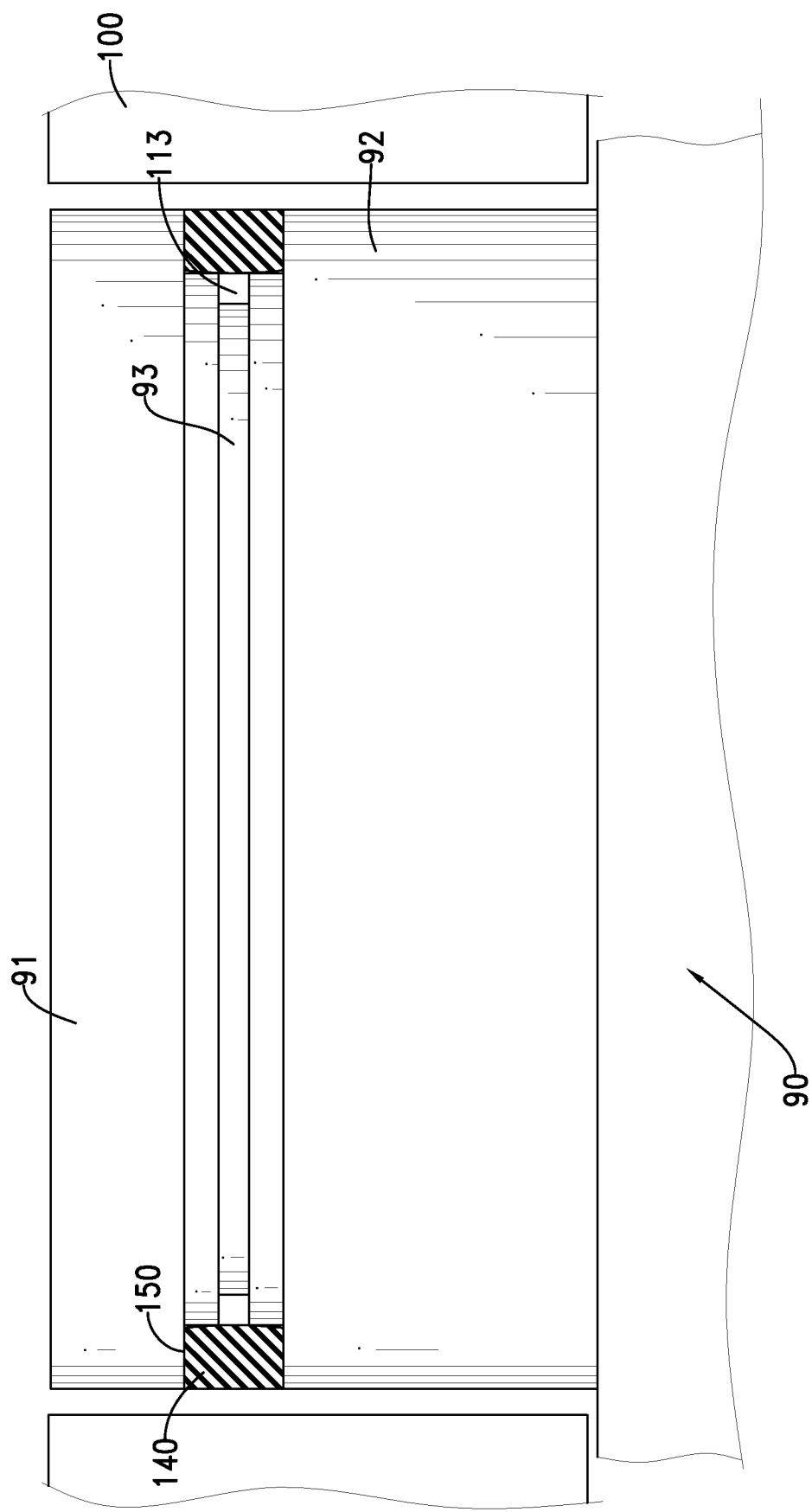
FIG. 11 is a schematic view of a replaceable elastomer ring disposed on the groove of a conventional electrostatic chuck.

With reference to FIG. 8, the eighth embodiment of the barrier seal is an elastomer ring 20E'. The cross-section of the elastomer ring 20E' is substantially in the shape of a cap. The elastomer ring 20E' comprises: a primary sealing portion 21E' and a third minor sealing portion 24E'. The primary sealing portion 21E' toward the groove 14 further comprises two edges 211E'. The two edges 211E' are chamfered edges. One of the two edges 211E' is corresponding to a corner between the bottom portion 111 and the top portion 112 of the upper element 11. Another one of the two edges 211E' is very close to a top surface of the bottom element 13. The third minor sealing portion 24E' protrudes from an outer side of the primary sealing portion 21E' in a direction away from the groove 14. A height H2 of the third minor sealing portion 24E' is larger than a height h2 of the primary sealing portion 21E', and the third minor sealing portion 24E' is in contact with the top portion 112 of the upper element 11 and the bottom element 13 respectively. The gap 31 between the electrostatic chuck 10 and the extending element 30 may be blocked by the third minor sealing portion 24E'. The third minor sealing portion 24E' may stop the plasma gas 40 from flowing into the gap 31 and the groove 14. The third minor sealing portion 24E' effectively prevents the damage of the connecting layer 12 caused by the etching of the plasma gas 40.

The differences between the elastomer ring 20E and the elastomer ring 20E' are the height h1, h2 of the primary sealing portion and the height H1, H2 of the third minor sealing portion. Different designs of the bottom element 13, 13A may be used with the elastomer ring 20E' or the elastomer ring 20E respectively with reference to FIGS. 7 and 8. Engineers may select the appropriate elastomer ring 20E or the elastomer ring 20E' to use with the different electrostatic chucks 10.

All kinds of the elastomer rings 20, 20A, 20B, 20C, 20C', 20D, 20E, 20E' are made of rubber. The elastic property of the rubber may help the elastomer ring 20, 20A, 20B, 20C, 20C', 20D, 20E, 20E' be disposed in the groove 14, 14A evenly and completely. The elastomer ring 20, 20A, 20B, 20C, 20C', 20D, 20E, 20E' may effectively prevent the damage of the connecting layer 12, 12A caused by the etching of the plasma gas 40.

In summary, the barrier seal for a sidewall of the electrostatic chuck 10 utilizes multiple sealing portions such as double or triple sealing portions to prevent the plasma gas 40 from flowing into the groove 14, 14A or the gaps 31, 31A to damage the connecting layer 12, 12A. Even one of the multiple sealing portions is destroyed by the plasma gas 40, the gas leak of the electrostatic chuck 10, 10A will not occur. Engineers may timely replace the damaged barrier seal before the leaking. The present invention is beneficial for the development of the semiconductor industry.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A barrier seal for use on an electrostatic chuck, the electrostatic chuck comprising:
   an upper element;
   a bottom element;
   a connecting layer connecting the upper element and the bottom element; and
   a groove formed among an outer edge of the connecting layer, the upper element, and the bottom element; and
   the barrier seal being an elastomer ring and comprising:
      a primary sealing portion; and
      at least one minor sealing portion protruding away from a side of the primary sealing portion;
   wherein a side of the primary sealing portion toward the groove comprises two edges; the two edges are each a chamfered edge;
   the at least one minor sealing portion comprises a first minor sealing portion;
   wherein the first minor sealing portion protrudes from an inner side of the primary sealing portion toward the groove; and
   wherein a cross-section of the barrier seal is in a T shape.

2. The barrier seal for an electrostatic chuck as claimed in claim 1, wherein a side of the first minor sealing portion toward the groove comprises two edges; the two edges are chamfered edges.

3. The barrier seal for an electrostatic chuck as claimed in claim 1, wherein the at least one minor sealing portion further comprises at least one second minor sealing portion; the at least one second minor sealing portion protrudes from an outer side of the primary sealing portion in a direction away from the groove.

4. The barrier seal for an electrostatic chuck as claimed in claim 2, wherein the at least one minor sealing portion further comprises at least one second minor sealing portion; the at least one second minor sealing portion protrudes from an outer side of the primary sealing portion in a direction away from the groove.

5. The barrier seal for an electrostatic chuck as claimed in claim 3, wherein the at least one second minor sealing portion comprises a chamfered edge away from the groove.

6. The barrier seal for an electrostatic chuck as claimed in claim 4, wherein the at least one second minor sealing portion comprises a chamfered edge away from the groove.

7. The barrier seal for an electrostatic chuck as claimed in claim 1, wherein the at least one minor sealing portion further comprises a third minor sealing portion; the third minor sealing portion protrudes from an outer side of the primary sealing portion in a direction away from the groove; a height of the third minor sealing portion is larger than a height of the primary sealing portion, and the third minor sealing portion is in contact with the upper element and the bottom element of the electrostatic chuck respectively.

8. The barrier seal for an electrostatic chuck as claimed in claim 2, wherein the at least one minor sealing portion further comprises a third minor sealing portion; the third minor sealing portion protrudes from an outer side of the primary sealing portion in a direction away from the groove; a height of the third minor sealing portion is larger than a height of the primary sealing portion, and the third minor sealing portion is in contact with the upper element and the bottom element of the electrostatic chuck respectively.

* * * * *